(12) United States Patent
Sakakibara

(10) Patent No.: US 8,274,723 B2
(45) Date of Patent: Sep. 25, 2012

(54) PIEZOELECTRIC TRANSDUCER ELEMENT, ACTUATOR, SENSOR, OPTICAL SCANNING DEVICE, AND OPTICAL SCANNING DISPLAY DEVICE

(75) Inventor: Masahiro Sakakibara, Toyokawa (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 407 days.

(21) Appl. No.: 12/659,745

(22) Filed: Mar. 19, 2010

(65) Prior Publication Data
US 2010/0177370 A1    Jul. 15, 2010

Related U.S. Application Data

(63) Continuation-in-part of application No. PCT/JP2008/067402, filed on Sep. 26, 2008.

(30) Foreign Application Priority Data

Sep. 26, 2007  (JP) .................................. 2007-250078

(51) Int. Cl.
*G02B 26/08*     (2006.01)
(52) U.S. Cl. ............... 359/224.1; 359/198.1; 359/199.1; 359/199.4; 359/221.2; 310/311
(58) Field of Classification Search ............... 359/198.1, 359/199.4, 200.8, 221.2; 310/311, 317, 321, 310/323.06, 328, 330
See application file for complete search history.

(56) References Cited

U.S. PATENT DOCUMENTS

| | | | | |
|---|---|---|---|---|
| 6,624,549 B2 * | 9/2003 | Takeuchi et al. | ............... | 310/330 |
| 7,605,966 B2 * | 10/2009 | Tani et al. | .................. | 359/224.1 |
| 2006/0290449 A1 * | 12/2006 | Piazza et al. | .................. | 333/187 |

FOREIGN PATENT DOCUMENTS

| | | |
|---|---|---|
| JP | A-2005-191047 | 7/2005 |
| JP | A-2006-320089 | 11/2006 |

OTHER PUBLICATIONS

International Search Report issued on Oct. 21, 2008 in International Application No. PCT/JP2008/067402 (with translation).

\* cited by examiner

*Primary Examiner* — James Phan
(74) *Attorney, Agent, or Firm* — Oliff & Berridge, PLC

(57) ABSTRACT

In a piezoelectric transducer element, on a base body having a fixing part and a movable part which are connected with each other, a piezoelectric body which is sandwiched between a lower electrode and an upper electrode is formed in a state where the piezoelectric body extends between and over the fixing part and the movable part of the base body. The piezoelectric body converts a change in potential between the lower electrode and the upper electrode into mechanical displacement of the movable part relative to the fixing part or the mechanical displacement into the change in potential. The upper electrode includes a pad electrode for connection which is formed above the fixing part, and the lower electrode is not formed in a region above the fixing part and below the pad electrode.

7 Claims, 13 Drawing Sheets

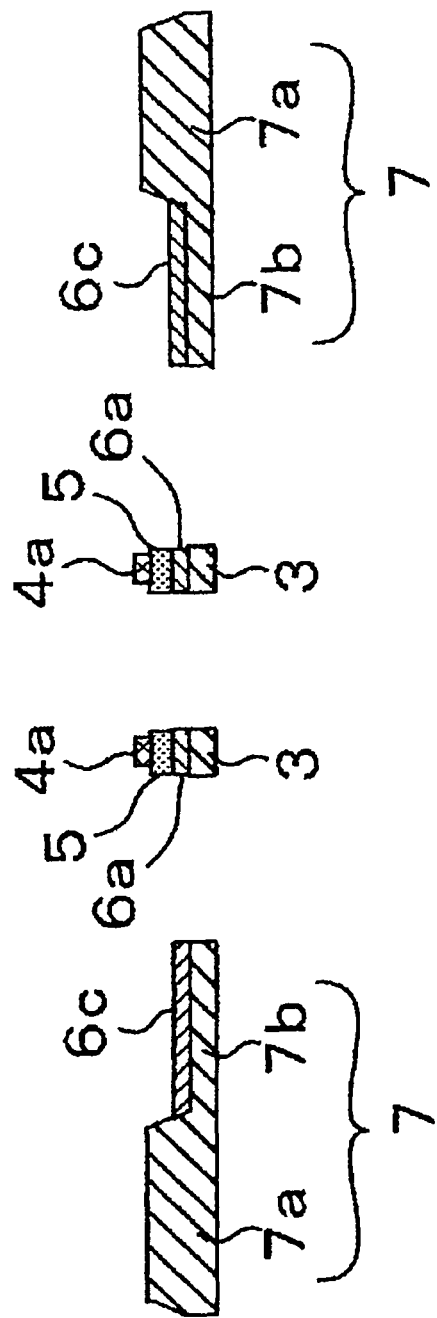
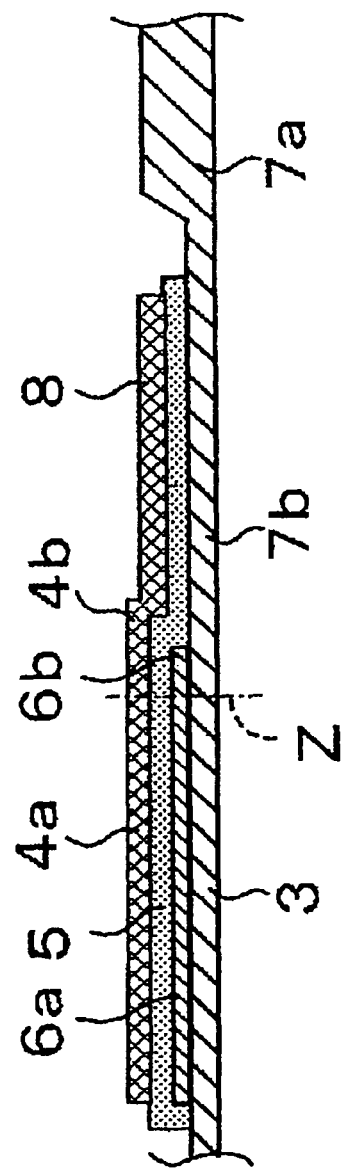

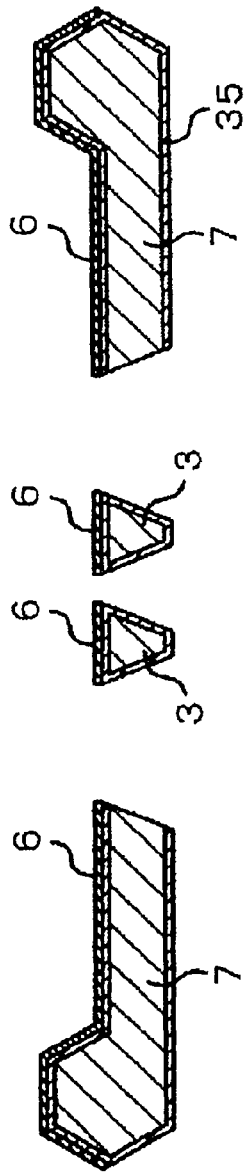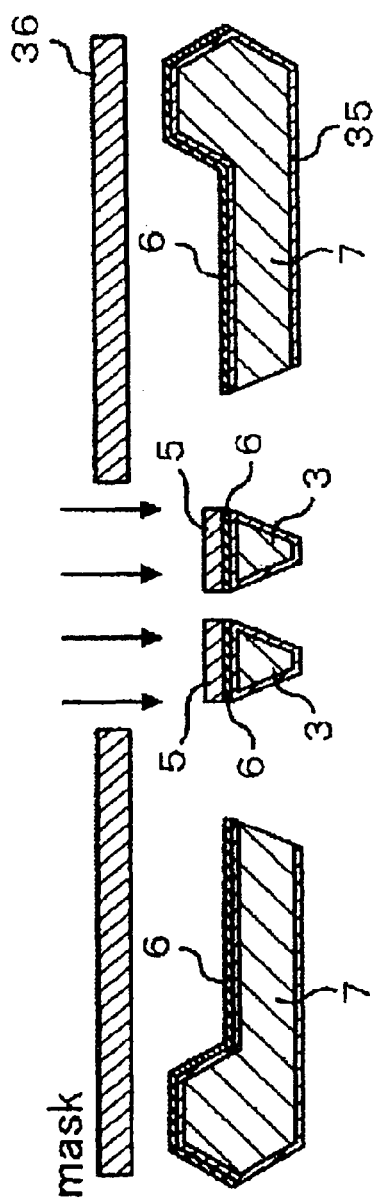

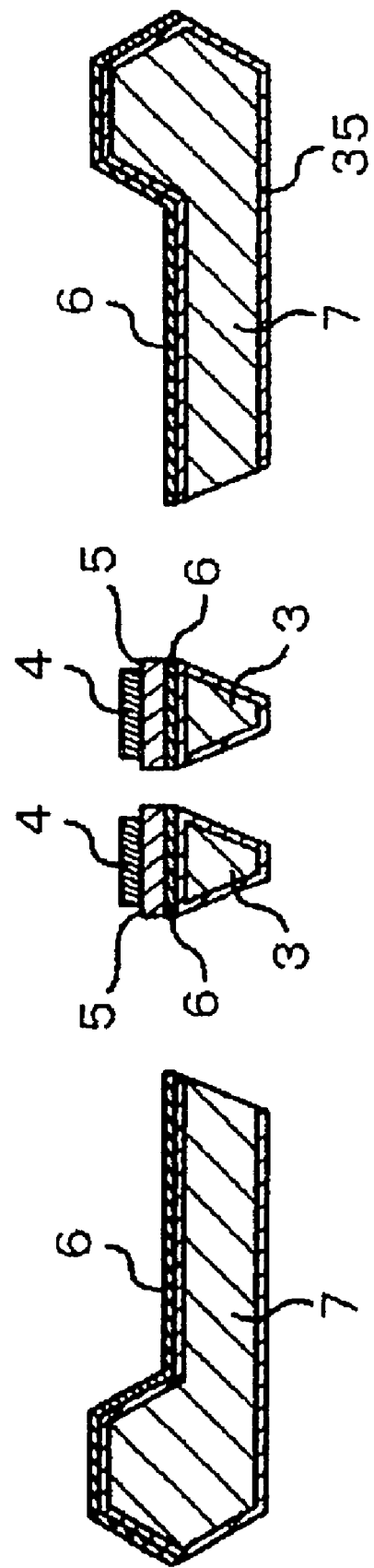

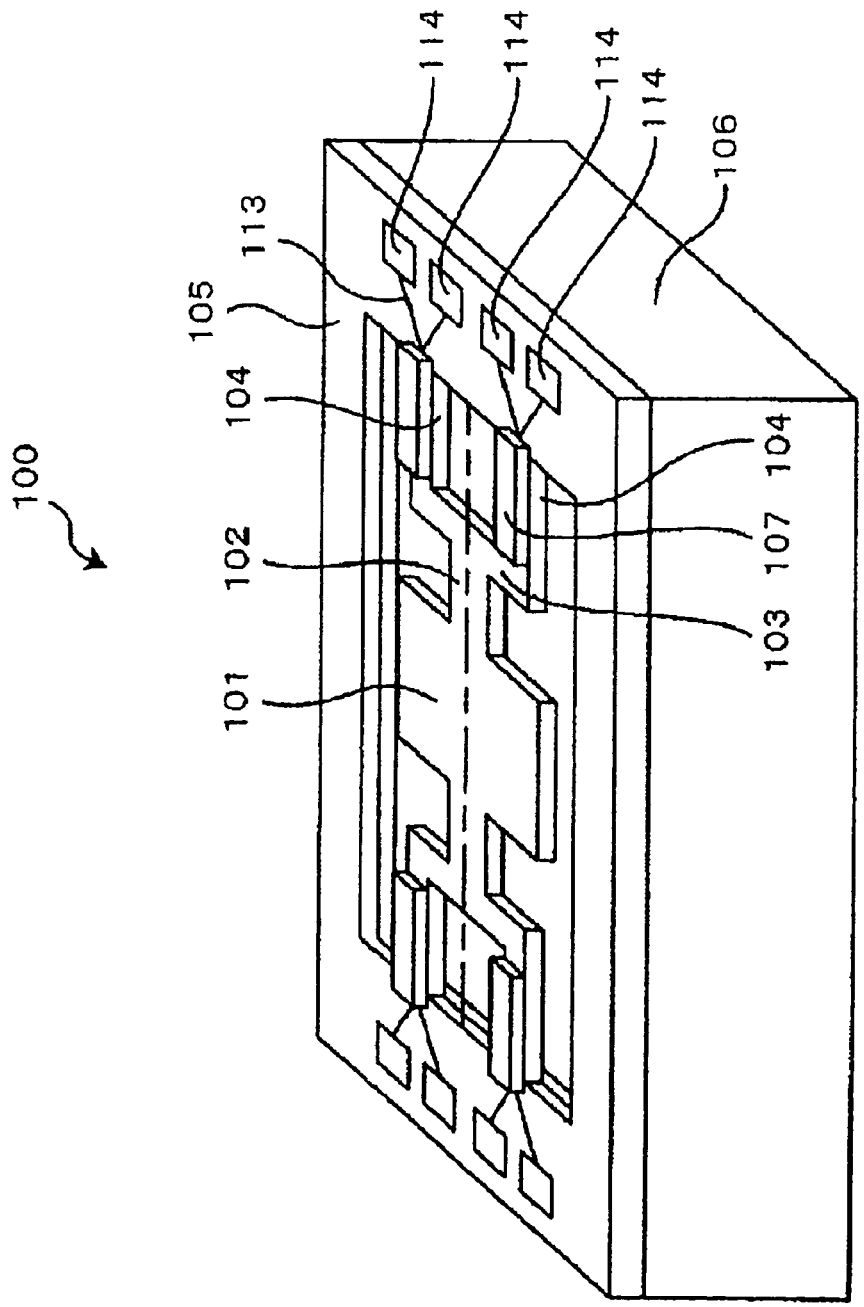

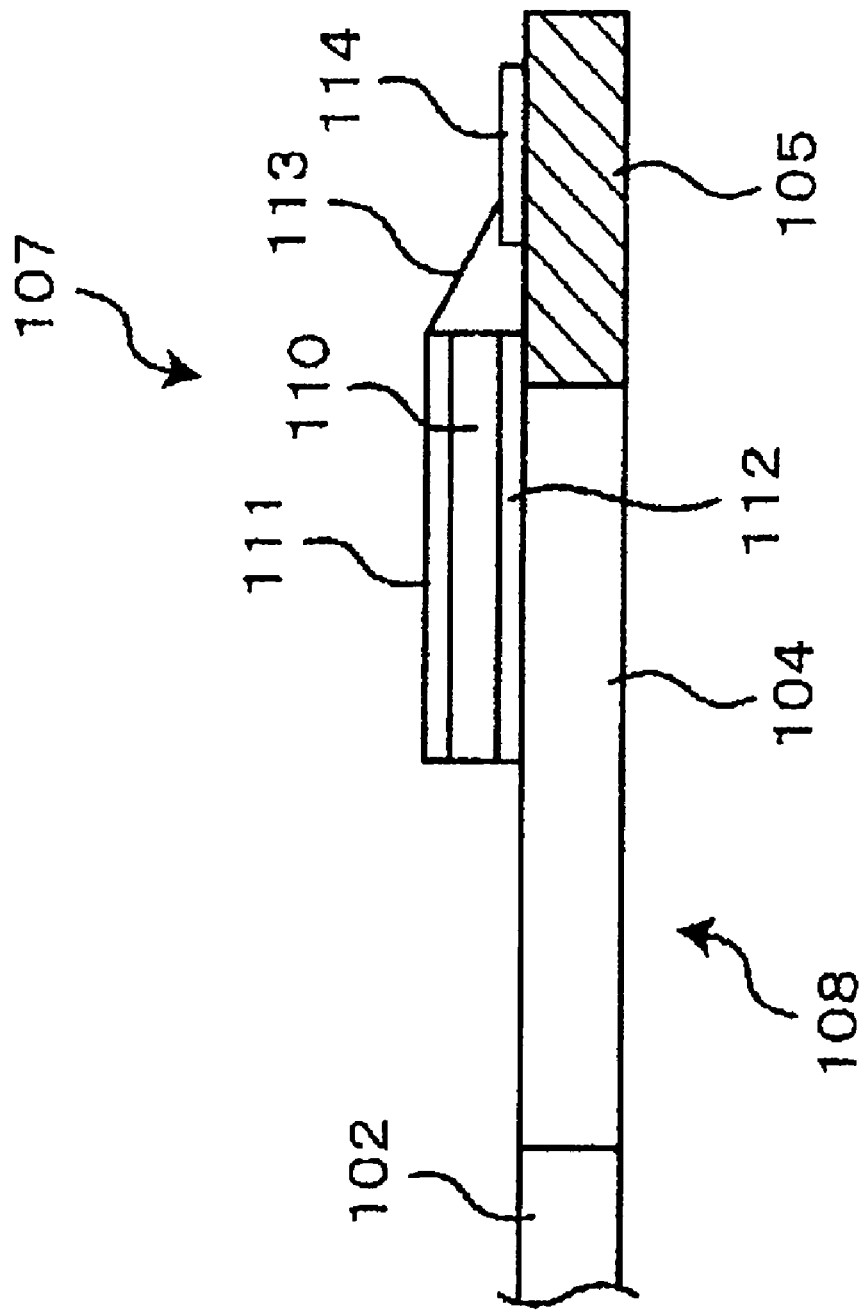

PIEZOELECTRIC TRANSDUCER ELEMENT, ACTUATOR, SENSOR, OPTICAL SCANNING DEVICE, AND OPTICAL SCANNING DISPLAY DEVICE

CROSS-REFERENCE TO RELATED APPLICATIONS

The present application is a Continuation-in-Part of International Application PCT/JP2008/067402 filed on Sep. 26, 2008, which claims the benefits of Japanese Patent Application No. 2007-250078 filed on Sep. 26, 2007.

BACKGROUND

1. Field

The present invention relates to a piezoelectric transducer element which is constituted of a piezoelectric body fixed to a movable part and a fixing part in a state where the piezoelectric body extends between and over these portions, and more particularly to a piezoelectric transducer element which reduces an overlapping area of an upper electrode and a lower electrode mounted on a surface of the piezoelectric transducer element, and an actuator, a sensor, an optical scanning device and an optical scanning display device which include the piezoelectric transducer element.

2. Description of the Related Art

Conventionally, there has been known an optical scanning device or an actuator in which a piezoelectric element made of PZT (lead zirconate titanate) or BaTiO₃ (barium titanate) is fixed to a base body constituted of a fixing part and a movable part. A conventional optical scanning device 100 is, as shown in FIG. 6A, constituted of a swingable reflection surface 101, first beam portions 102 with elasticity which constitute a swing axis of the reflection surface 101, and second beam portions 103 which support the first beam portions 102, two third beam portions 104 with elasticity which support the second beam portions 103, a fixing frame 105 which fixes the third beam portions 104 thereto, and a support portion 106 which supports the fixing frame 105. The above-mentioned structure has the symmetrical structure with respect to the reflection surface 101. Further, a strain generating element 107 is fixed to an upper portion of the third beam portion 104 in a state where the strain generating element 107 extends between and over the third beam portion 104 which constitutes a movable part and the fixing frame 105 to which the third beam portion 104 is fixed.

As shown in FIG. 6B, the strain generating element 107 is mounted in a state where the strain generating element 107 extends over between the frame-side third beam portion 104 and the fixing frame 105. The strain generating element 107 is constituted of a piezoelectric element 110, an upper electrode 111 and a lower electrode 112 which are formed on both surfaces of the piezoelectric element 110 respectively, input terminals 114 which are formed on the fixing frame 105, and lead wires 113 which electrically connect the upper electrode 111 and the input terminals 114 to each other.

The optical scanning device 100 is driven as follows. When an AC voltage is applied between the upper electrode 111 and the lower electrode 112 of the strain generating element 107, a stress in the vertical direction is imparted to the third beam portion 104 by the strain generating element 107. By applying AC electric fields whose polarities are inverted from each other to two strain generating elements 107, a rotational stress is imparted to the first beam portions 102. Accordingly, the reflection surface 101 swings using the first beam portions 102 as the swing axis. As a result, an incident optical flux which is incident on the reflection surface 101 is scanned when the incident optical flux is reflected and is converted into a scanning optical flux.

Here, the strain generating element 107 of this type usually has an extremely small shape such that a width of the strain generating element 107 is approximately 0.1 mm. Accordingly, a width of the upper electrode 111 which is formed on the piezoelectric element 110 also has an extremely small shape such that a width of the upper electrode 111 is approximately 0.1 mm. The lead wire is wired between the upper electrode 111 and the input terminal 114 formed on the fixing frame 105. A stepped portion formed due to a thickness of the piezoelectric element 110 is present between the input terminal 114 formed on the fixing frame 105 and the upper electrode 111 formed on the piezoelectric element 110. Accordingly, it is difficult to electrically connect an upper surface of the piezoelectric element 110 and the electrode on the fixing frame 105 with each other by a vacuum depositing method such as a sputtering method or a vapor deposition method. In view of the above, the upper electrode 111 formed on the piezoelectric element 110 and the input terminal 114 formed on the fixing frame 105 are electrically connected with each other using the lead wire 113. The lead wires 113 are connected by wire bonding.

In performing the wire bonding, a pressure is applied to a portion to which bonding is applied. When the portion to which the wire bonding is applied is the upper electrode 111 arranged above the third beam portion 104, since the third beam portion 104 has a free end, the pressure cannot be applied to the third beam portion 104. Accordingly, in the above-mentioned related art, the piezoelectric element 110 extends to the fixing frame 105 and is mounted on the upper electrode 111 above the fixing frame 105 by wire bonding.

As shown in FIG. 6C, a pad electrode 115 is formed on the piezoelectric element 110 above the fixing frame 105. The piezoelectric element 110 is formed such that the piezoelectric element 110 extends between and over the third beam portion 104 and the fixing frame 105. In a region of the third beam portion 104, the piezoelectric element 110 is sandwiched between the lower electrode 112 and the upper electrode 111. The lower electrode 112 is formed so as to extend over the surface of the fixing frame 105 and is continuously connected to the input terminal 114b. On an upper surface of the piezoelectric element 110, the upper electrode 111 and the pad electrode 115 which is included in the upper electrode 111 are formed. The pad electrode 115 is formed above the fixing frame 105. The input terminal 114a and the pad electrode 115 are electrically connected with each other by the lead wire 113. Since the pad electrode 115 is formed above the fixing frame 105, it is possible to sufficiently support the pad electrode 115 even when a pressure is applied to the pad electrode 115 in performing the wire bonding of the lead wire 113.

In the above-mentioned optical scanning device 100 of the related art, the lower electrode 112 is formed on the whole lower surface of the piezoelectric element 110. Accordingly, a large electrostatic capacity is generated between the pad electrode 115 and the lower electrode 112. This electrostatic capacity is equal to or larger than an electrostatic capacity in the movable part which is generated between the lower electrode 112 and the upper electrode 111 above the third beam portion 104. As a result, to apply an electric field between the upper electrode 111 and the lower electrode 112 for driving the scanning device, it is necessary to supply an electric current twice or more times as large as an electric current which actually flows in the movable part. Further, to consider a case where the optical scanning device 100 is used as an oscillation sensor, a piezoelectric current generated in the movable part is consumed as an electrostatic capacity in portions other than the movable part and hence, a detection current is reduced. Accordingly, there arises a drawback that a voltage signal taken out from the optical scanning device 100 becomes small or the response characteristics of a signal taken out from the optical scanning device 100 are lowered.

To overcome the above-mentioned drawbacks, according to one aspect of the present invention, there is provided a piezoelectric transducer element which includes: a base body which includes a fixing part and a movable part; a lower electrode which is formed on a surface of the base body; a piezoelectric body which is formed in a stacked manner in a state where the piezoelectric body extends between and over the fixing part and the movable part of the base body; and an upper electrode which is formed on a surface of the piezoelectric body on a side opposite to the base body. The piezoelectric body converts a change in potential between the lower electrode and the upper electrode into mechanical displacement of the movable part relative to the fixing part or converts the mechanical displacement into the change in potential. The upper electrode includes a pad electrode for connection which is formed above the fixing part, and the lower electrode is not formed in a region above the fixing part and below the pad electrode. The piezoelectric transducer element may be used for an actuator, a sensor, an optical scanning device, an optical scanning display device or the like.

BRIEF EXPLANATION OF THE DRAWINGS

FIG. 2B is a schematic cross-sectional view taken along a line X-X' in

FIG. 2A;

FIG. 2C is a schematic partial cross-sectional view taken along a line Y-Y' in FIG. 2A;

FIG. 4A to FIG. 4E are explanatory views showing manufacturing steps of the piezoelectric transducer element according to the embodiment of the present invention;

FIG. 6A is a schematic appearance view of a conventionally known optical scanning display device;

FIG. 6B is a cross-sectional view of one strain generating element of the optical scanning device shown in FIG. 6A.

DESCRIPTION OF THE PREFERRED EMBODIMENTS

Hereinafter, the present invention is explained in detail in conjunction with drawings.

Figure 1:
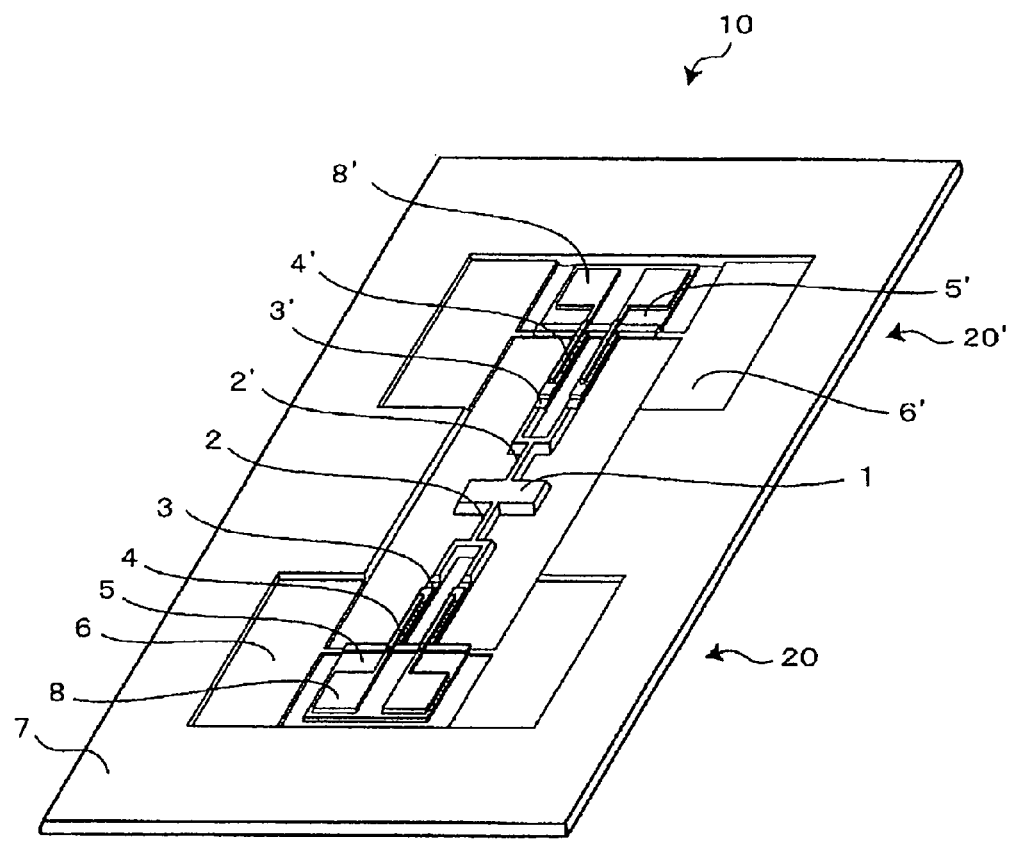
FIG. 1 is an appearance view of a piezoelectric transducer element and an optical scanning device according to an embodiment of the present invention.

FIG. 1 is a schematic appearance view showing a piezoelectric transducer element according to an embodiment of the present invention and showing a state in which the piezoelectric transducer element is applied to an optical scanning device.

As shown in FIG. 1, the optical scanning device 10 is constituted of a mirror portion 1 which forms a reflection surface on a front surface thereof, beam portions 2, 2' with elasticity which support the mirror portion 1 from both sides of the mirror portion 1 and constitute a swing axis or an oscillation axis of the mirror portion 1, movable parts 3, 3' which have the bifurcated structure and are formed of a resilient body for oscillating the beam portions 2, 2', and a fixing part 7 which holds the movable parts 3, 3'. On one side of a base body constituted of the movable part 3 and the fixing part 7, a piezoelectric transducer element 20 which is constituted of a lower electrode 6, a piezoelectric body 5, an upper electrode 4, and a pad electrode 8 which constitutes a portion of the upper electrode 4 is formed. In the same manner, on the other side of a base body constituted of the movable part 3' and the fixing part 7, a piezoelectric transducer element 20' which is constituted of a lower electrode 6', a piezoelectric body 5', an upper electrode 4', and a pad electrode 8' which constitutes a portion of the upper electrode 4' is formed.

Figure 2A:
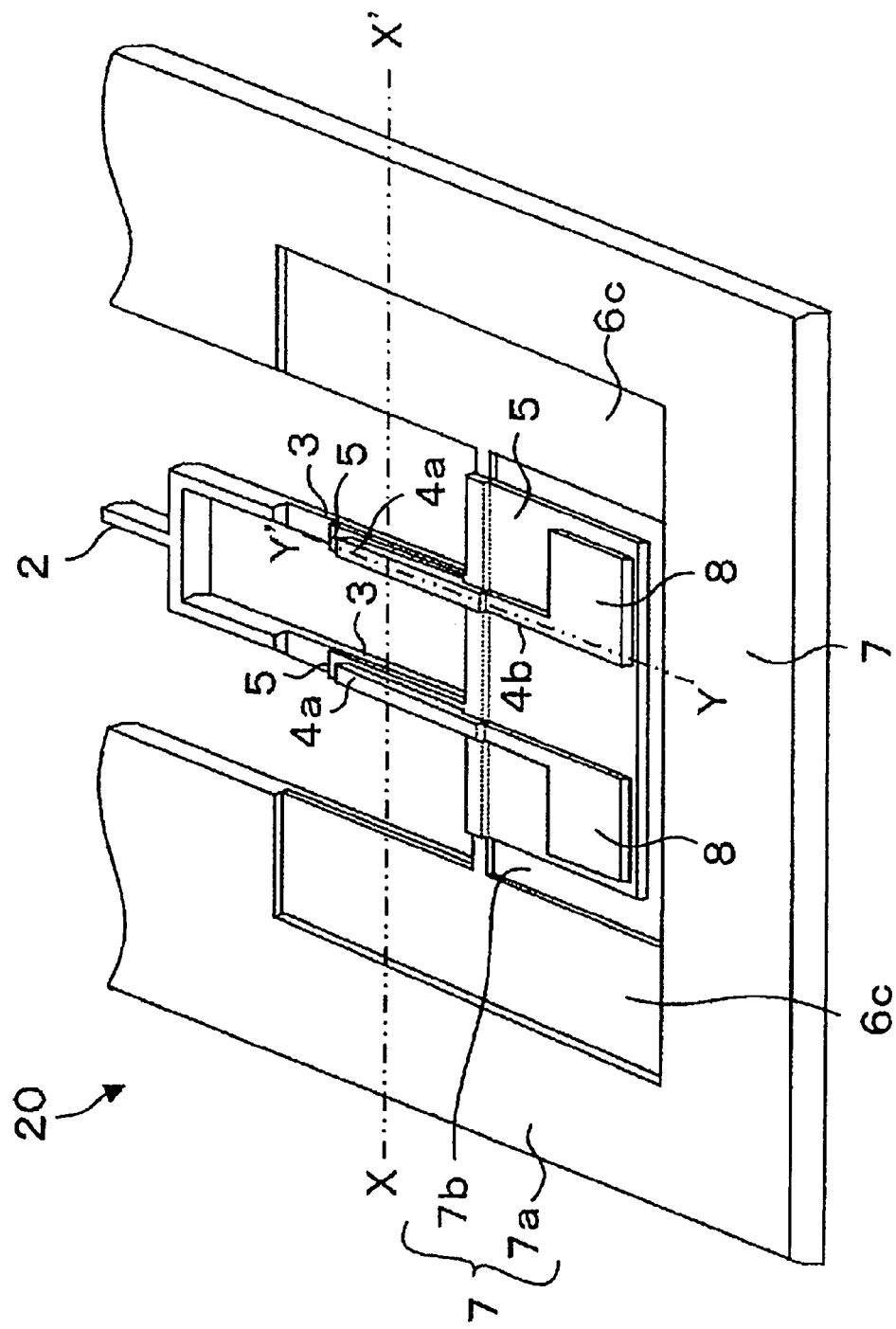
FIG. 2A is a schematic perspective view showing the piezoelectric transducer element in a lower-side region of the optical scanning device in an enlarged manner.
Figure 2D:
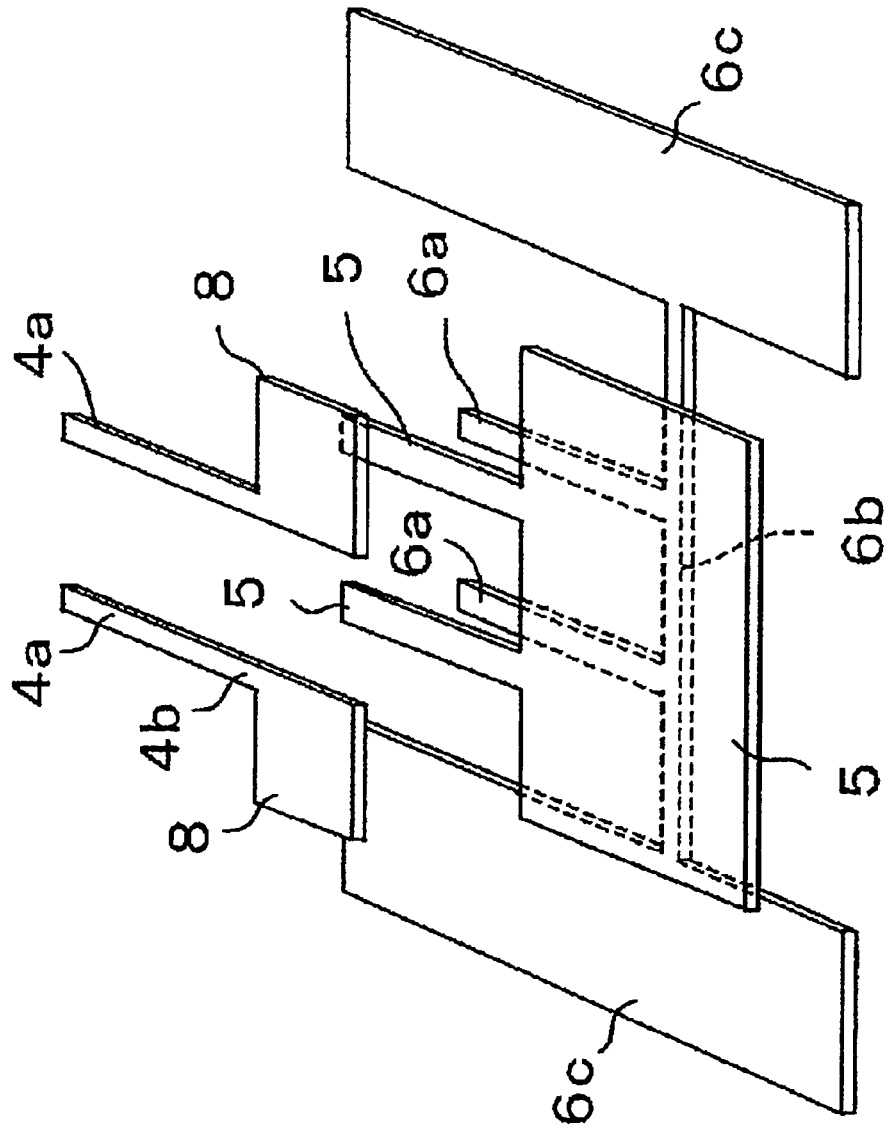
FIG. 2D is a schematic exploded perspective view showing an upper electrode, a piezoelectric body and a lower electrode of the piezoelectric transducer element shown in FIG. 2A.

The piezoelectric transducer element 20 which is arranged on a lower region of the optical scanning device 10 is specifically explained in detail in conjunction with FIG. 2A to FIG. 2C. As shown in FIG. 2A to FIG. 2C, the fixing part 7 is constituted of a frame-shaped outer-peripheral fixing part 7a and an element fixing part 7b on which the piezoelectric body 5 and the like are formed. The element fixing part 7b and the movable part 3 having the same thickness are connected with each other at a boundary Z defined therebetween. The movable parts 3 are connected to the element fixing part 7b such that two rod-shaped projections project from the plate-like element fixing part 7b. The element fixing part 7b has a thickness smaller than a thickness of the outer-periphery fixing part 7a. The element fixing part 7b is connected to two projecting movable parts 3. The movable parts 3 have the same thickness as the element fixing part 7b. Distal end portions of two movable parts 3 have the same thickness as the outer-periphery fixing part 7a and are connected to the beam portion 2. The beam portion 2 is connected to the mirror portion 1 having the same thickness as the beam portion 2. These fixing part 7, movable parts 3, the beam portion 2 and the mirror portion 1 are integrally formed using the same material. For example, as such a material, silicon semiconductor single crystal is used.

On respective surfaces of the element fixing part 7b and the movable parts 3 which constitute the base body, a patterned lower electrode 6 is formed. The piezoelectric body 5 is stacked on and fixed to the element fixing part 7b and the lower electrode 6. A patterned upper electrode 4 is formed on a surface of the piezoelectric body 5 on a side opposite to the lower electrode 6. To be more specific, the lower electrode 6 is constituted of rod-shaped rectangular lower movable electrodes 6a which are arranged on upper surfaces of the movable parts 3 and below the piezoelectric body 5, a lower fixed electrode 6b which is arranged on an upper surface of the element fixing part 7b and below the piezoelectric body 5 and is connected to the lower movable electrodes 6a at a boundary Z, and lower outer electrodes 6c which are positioned at regions where the piezoelectric body 5 is not stacked. Further, the respective electrodes 6a to 6c are electrically connected with each other. The piezoelectric body 5 is stacked on and fixed to the element fixing part 7b and the movable parts 3 such that the piezoelectric body 5 extends between and over the element fixing part 7b and the movable parts 3. The upper electrode 4 is constituted of rod-shaped upper movable electrodes 4a having a rectangular shape which are positioned above the movable parts 3, upper fixed electrodes 4b which are positioned above the element fixing part 7b and are connected to the upper movable electrodes 4a respectively at the boundary Z, and pad electrodes 8 which constitute portions of the upper fixed electrodes 4b. The respective electrodes are electrically connected with each other. Further, the lower fixed electrode 6b is not formed below the pad electrodes 8.

When a voltage is applied between the upper electrode 4 and the lower electrode 6, a piezoelectric reverse effect is generated on the piezoelectric body 5 in a region where the upper electrode 4 and the lower electrode 6 overlap with each other thus displacing the movable part 3 in the vertical direction. That is, the mechanical displacement is generated on the movable part 3 which constitutes a free end and hence, the piezoelectric transducer element functions as an actuator. To the contrary, when the mechanical displacement is imparted to the movable parts 3, the piezoelectric body 5 in a region where the upper electrode 4 and the lower electrode 6 overlap with each other generates an electric potential due to a piezoelectric effect and hence, the piezoelectric transducer element can be used as a sensor which converts the mechanical displacement into a change in electric potential such as an oscillation sensor or a stress detection sensor, for example.

In this embodiment, the lower electrode 6 is not formed below the pad electrode 8 which constitutes a portion of the upper electrode 4. In a region of the element fixing part 7b, the upper electrode 4 and the lower electrode 6 overlap with each other only at intersecting portions of the lower fixed electrode 6b which has an electrode width substantially equal to an electrode width of the lower movable electrode 6a and the upper fixed electrode 4b which has an electrode width substantially equal to an electrode width of the upper movable electrode 4a. An electrostatic capacity is proportional to an overlapping electrode area of the upper and lower electrodes provided that the piezoelectric body has the same thickness. In this embodiment, an overlapping area of the upper fixed electrode 4b and the lower fixed electrode 6b positioned above the element fixing part 7b is one over several or less of an overlapping area of the upper movable electrode 4a and the lower movable electrode 6a positioned above the movable part 3. As a result, the electrostatic capacity in the region of the element fixing part 7b is reduced. Accordingly, when the piezoelectric transducer element 20 is used as an actuator, it is possible to largely reduce the power consumption. On the other hand, when the piezoelectric transducer element 20 is used as a sensor, it is possible to effectively take out a voltage generated in the region of the movable part 3 thus providing a sensor which exhibits rapid response characteristics.

The manner of operation of the optical scanning device 10 which uses the piezoelectric transducer element 20 is specifically explained hereinafter. An AC voltage is applied between one pad electrode 8 and the lower electrode 6, and an AC voltage having a phase opposite to a phase of the above-mentioned alternating voltage is applied between the other pad electrode 8 and the lower electrode 6. When the AC voltage is applied in such a manner, two movable parts 3 are alternately moved in the vertical direction. Such vertical movement is transmitted to the mirror portion 1 by way of the beam portion 2, and the mirror portion 1 is operated using the beam portion 2 as a swing axis. When a light beam is radiated to the mirror portion 1, a reflection beam is scanned along with the oscillation of the mirror portion 1. Accordingly, by radiating a light beam which is modulated based on a video or image information to the oscillating mirror portion 1 and projecting a reflection beam reflected on the mirror portion 1 onto a screen or a rotary drum of a printer, it is possible to perform a display or printing of a video or an image.

Further, when a voltage having the same polarity is applied between the two pad electrodes 8 and the lower electrodes 6, two movable parts 3 are displaced upward or downward. The mirror portion 1 is also displaced in the vertical direction based on the displacement of the movable parts 3. For example, by radiating light beam to the mirror portion 1 in the direction perpendicular to the mirror portion 1 and by allowing the mirror portion 1 to reflect the light beam, it is possible to change an optical path length of the reflected beam. That is, it is possible to operate the piezoelectric transducer element 20 as an actuator for displacing the mirror portion 1.

Further, out of two beam portions 2 which support the mirror portion 1, the piezoelectric transducer element 20 on one beam-portion-2 side may be used as an actuator which generates the oscillations of the mirror portion 1, and the piezoelectric transducer element 20 on the other beam-portion-2 side may be used as a sensor which detects the oscillations of the mirror portion 1. For example, the mirror portion 1 may be resonated by imparting an AC electric field to one piezoelectric transducer element 20, and a magnitude of the oscillations of the mirror portion 1 may be detected by the other piezoelectric transducer element 20 such that a feedback control of the oscillations of the mirror portion 1 is realized.

Here, in the above-mentioned embodiment, with respect to the fixing part 7, a thickness of the element fixing part 7b on which the piezoelectric body 5 and the lower electrode 6 are formed is made small compared to a thickness of the outer periphery fixing part 7a. The thickness of the element fixing part 7b is made small so as to enhance a bending property of the movable part 3. However, by properly selecting a material of these elements, sizes of the elements or the like, it is not always necessary to reduce the thickness of the element fixing part 7b, and the outer-periphery fixing part 7a and the element fixing part 7b may have the same thickness.

Further, in the above-mentioned embodiment, the explanation has been made with respect to the case where two movable parts 3 which project from the element fixing part 7b are formed on the fixing part 7. However, the present invention is not limited to the above-Mentioned constitution. For example, one movable part 3 may be formed on the fixing part 7 in a projecting manner from the element fixing part 7b, and the movable part 3 may be used as a sensing lever. When the movable part 3 is used as a sensing lever of a scanning tunneling microscope, for example, the mirror portion 1 and a probe are formed on a distal end portion of the movable part 3. To allow a fixed tunneling current to flow between the probe and the test sample at the time of moving the probe on a surface of a test sample, a control voltage is applied between the upper electrode 4 and the lower electrode 6 so as to cause the piezoelectric body 5 to bend the movable part 3. A bending amount of the movable part 3 is detected by radiating a laser beam to the mirror portion 1 and detecting the displacement of the reflection laser beam. Due to such a constitution, surface irregularities of the test sample can be observed at high magnification.

Figure 3A:
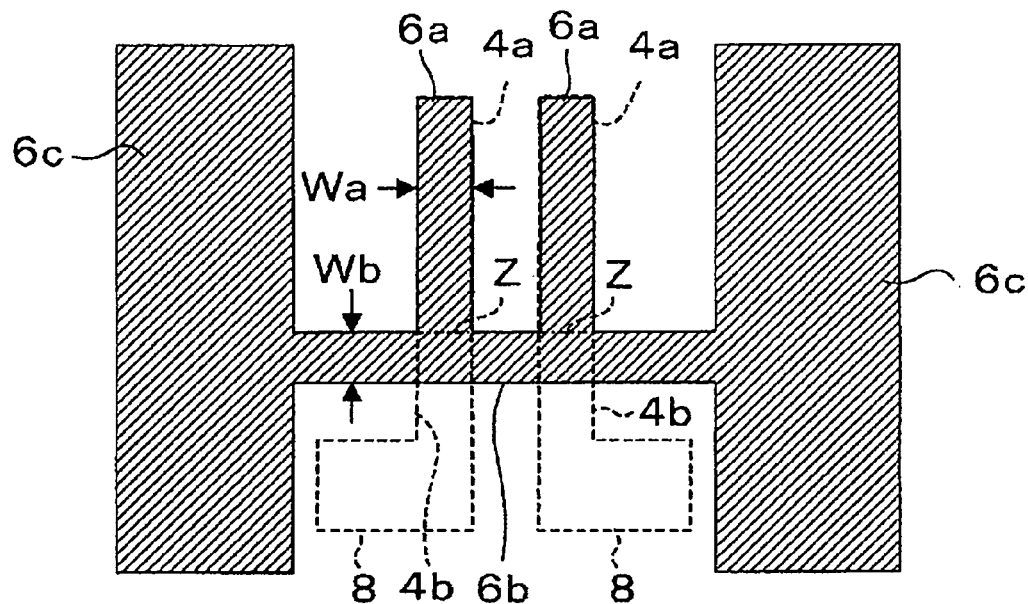
FIG. 3A to FIG. 3C are schematic front views showing a shape of an electrode of the piezoelectric transducer element according to the embodiment of the present invention.
Figure 3B:
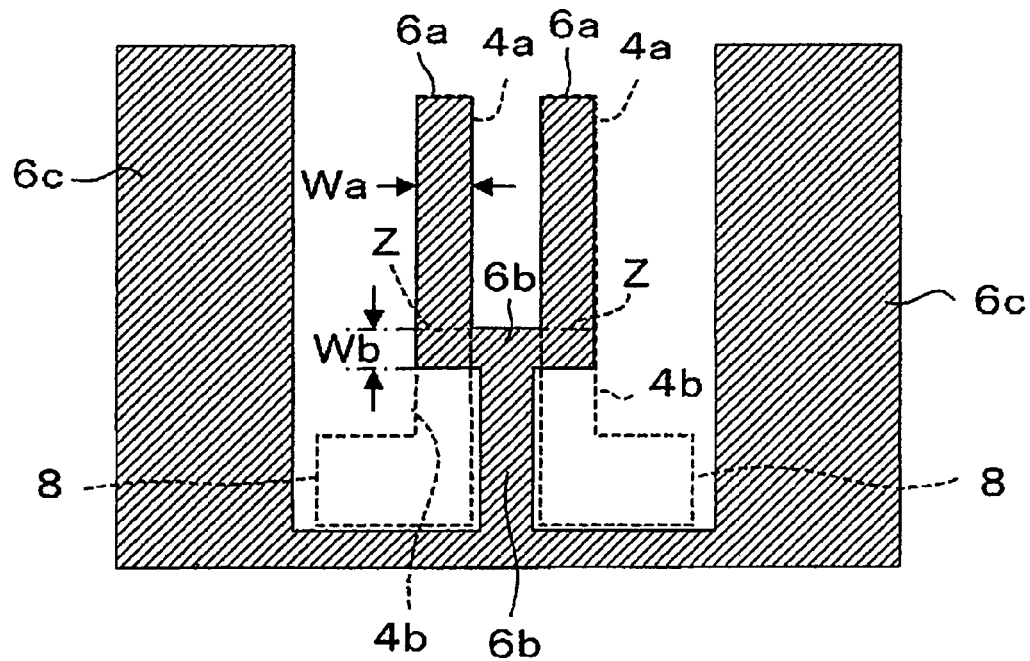
Figure 3C:
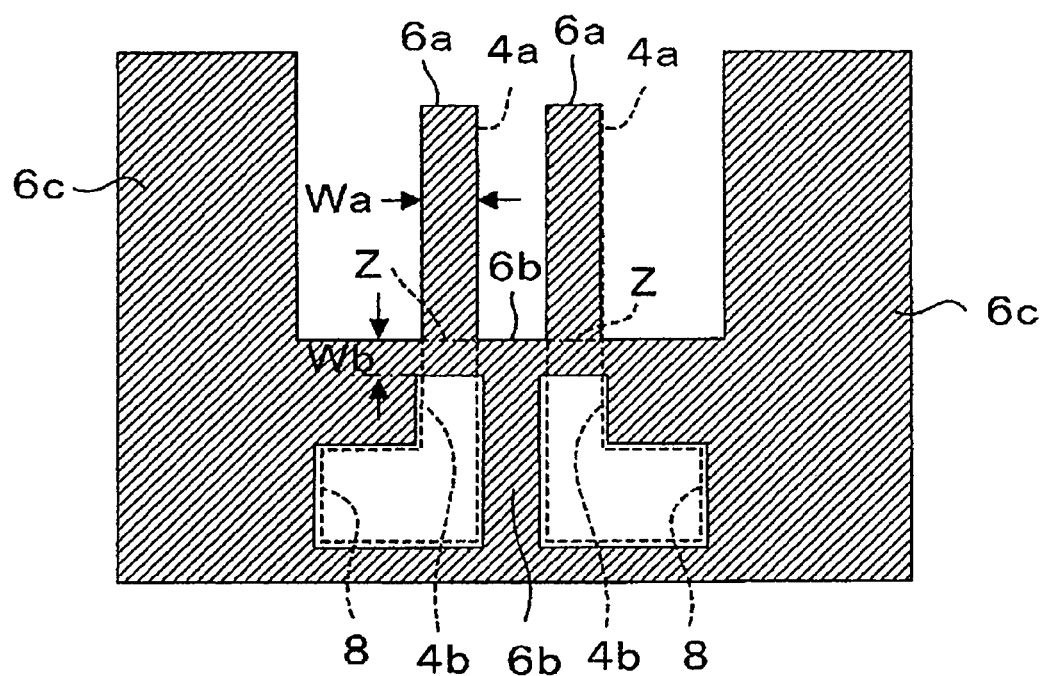

Specific examples of the upper electrodes 4 and the lower electrodes 6 which constitute the piezoelectric transducer element 20 of the present invention are explained in conjunction with FIG. 3A to FIG. 3C. In FIG. 3A to FIG. 3C, the upper electrodes 4 are indicated by a broken line, and the lower electrode 6 is indicated by a solidline hatching region. Here, in FIG. 3A to FIG. 3C, the boundary Z indicates a boundary between the movable part 3 and the fixing part 7. Further, parts and portions having identical functions are given same numerals and symbols. In FIG. 3A, the lower electrode 6 includes the lower movable electrode 6a which is formed above the movable part 3 and below the piezoelectric body 5, the lower fixed electrode 6b which is formed above the element fixing part 7b and below the piezoelectric body 5, and a lower external electrode 6c which is formed above the element fixing part 7b and in a region where the piezoelectric body 5 is not arranged. The upper electrode 4 includes the upper movable electrode 4a which is formed on a surface of the piezoelectric body 5 above the movable part 3, the upper fixed electrode 4b which is formed on a surface of the piezoelectric body 5 above the element fixing part 7b, and the pad electrode 8 which forms a portion of the upper fixed electrode 4b and is connected with the outside.

The lower movable electrode 6a, the lower fixed electrode 6b and the lower external electrode 6c are electrically connected with each other. In the same manner, the upper movable electrode 4a and the upper fixed electrode 4b are electrically connected with each other. Above the movable part 3, the upper movable electrode 4a and the lower movable electrode 6a are arranged in an overlapping manner so that it is possible to apply voltage to the piezoelectric body 5 or to take out voltage generated in the piezoelectric body 5. The lower electrode 6 is not formed in a region above the element fixing part 7b and below the pad electrode 8. Above the element fixing part 7b, an overlapping area S of the upper fixed electrode 4b having an electrode width Wa and the lower fixed electrode 6b having an electrode width Wb is obtained by a formula 2×Wa×Wb. A length of the piezoelectric body 5 on the movable part 3 is usually several times to several ten times or more larger than the width Wa. In this manner, an overlapping area of the upper fixed electrode 4b and the lower fixed electrode 6b becomes one over several to one over several tens or less of the overlapping area of the upper movable electrode 4a and the lower movable electrode 6a. Accordingly, an electrostatic capacity on the element fixing part 7b can be reduced to one over several to one over several tens or less of an electrostatic capacity on the movable part 3.

As a result, the electrostatic capacity of the piezoelectric transducer element 20 is reduced thus reducing the power consumption due to driving of the piezoelectric transducer element 20. Further, it is possible to increase a size of the pad electrode 8 without increasing electrostatic capacity and hence, the wire-bonding can be easily performed.

In FIG. 3B, the lower movable electrodes 6a and the lower external electrodes 6c are electrically connected with each other through a gap formed between two pad electrodes 8. That is, the lower fixed electrode 6b is formed such that the lower fixed electrode 6b is substantially positioned between two upper fixed electrodes 4b. Also in this case, above the element fixing part 7b, an overlapping area S of the upper fixed electrodes 4b having an electrode width Wa and the lower fixed electrode 6b having an electrode width Wb is expressed by a formula 2×Wa×Wb. Accordingly, the overlapping area of the upper fixed electrodes 4b and the lower fixed electrode 6b becomes one over several to one over several tens or less of the overlapping area of the upper movable electrode 4a and the movable electrode 6a thus reducing the electrostatic capacity on the element fixing part 7b.

In FIG. 3C, the lower fixed electrode 6b on the element fixing part 7b is removed in conformity with a shape of the upper fixed electrode 4b except for a connection area of the lower movable electrode 6a and the lower external electrode 6c. Also in this case, above the element fixing part 7b, an overlapping area S of the upper fixed electrodes 4b having an electrode width Wa and the lower fixed electrode 6b having an electrode width Wb is expressed by a formula 2×Wa×Wb. Accordingly, the overlapping area of the upper fixed electrodes 4b and the lower fixed electrode 6b becomes one over several to one over several tens or less of the overlapping area of the upper movable electrode 4a and the lower movable electrode 6a thus reducing electrostatic capacity on the element fixing part 7b. By forming the lower fixed electrode 6b into such a shape, it is possible to obtain an advantageous effect that a resistance between the lower movable electrode 6a and the lower external electrode 6c can be reduced.

Here, in the above-mentioned embodiment, the explanation is made with respect to a case in which the electrostatic capacity in the fixing region positioned above the element fixing part 7b is one over several to one over several tens or less of the electrostatic capacity in the movable region positioned above the movable part 3. However, even when the electrostatic capacity in the fixing region is set equal to or less than the electrostatic capacity in the movable region, it is possible to acquire an advantageous effect that the whole electrostatic capacity can be reduced. Particularly, in a conventional case where a region of the piezoelectric body 5 on the movable part 3 is smaller than an area of the pad electrode 8, electrostatic capacity in a fixing region is larger than electrostatic capacity in a movable region. This is because that a half or more of current consumption occurs in the fixing region, or a voltage (current) generated in the movable region is consumed by electrostatic capacity in the fixing region thus deteriorating the frequency characteristics.

Further, as in the case of the conventional example, when the lower fixed electrode 6b is formed on the whole lower surface of the upper fixed electrode 4b including the pad electrode 8, the mechanical displacement has been generated also on the piezoelectric body 5 arranged between the respective electrodes due to the application of voltage. Accordingly, there arises a drawback such as peeling-off of the piezoelectric body 5 from the element fixing part 7b or disconnection of the upper fixed electrode 4b. To the contrary, according to the above-mentioned embodiment of the present invention, the lower fixed electrode 6b is not formed on the surface of the element fixing part 7b at least in regions corresponding to the pad electrodes 8, and the piezoelectric body 5 is directly stacked on the surface of the element fixing part 7b. As a result, the mechanical displacement attributed to the piezoelectric body 5 is not generated in the vicinity of the pad electrodes 8 and hence, it is possible to obtain an advantageous effect that peeling-off or disconnection of the piezoelectric body 5 can be prevented.

Here, in the above-mentioned embodiment, electrodes are not formed in regions below the pad electrodes 8. However, in general, the adhesiveness of the piezoelectric body 5 to a ground material is enhanced by stacking the piezoelectric body 5 on the surface of the element fixing part 7b formed of a silicon oxide film or the like by way of the electrode rather than directly stacking the piezoelectric body 5 on the surface of the element fixing part 7b. In view of such understanding, an additional electrode which is electrically insulated from the lower fixed electrode 6b is formed on the surface of the element fixing part 7b in regions below the pad electrodes 8. For example, the additional electrode is formed into a dotted manner or in a planar shape and is insulated from the lower fixed electrode 6b. Due to such a constitution, it is possible to enhance the adhesiveness of the piezoelectric body 5 to the element fixing part 7b without generating additional electrostatic capacity in the regions of the pad electrodes 8.

Further, in the above-mentioned embodiment, although the explanation has been made with respect to the piezoelectric transducer element 20 in which two movable parts 3 project from the element fixing part 7b, the piezoelectric transducer element 20 is not limited to the above-mentioned constitution. One movable part 3 may project from the element fixing part 7b, or the movable parts 3 may be formed of one planar projecting part.

Manufacturing steps of the optical scanning device 10 shown in FIG. 1 and FIG. 2A to FIG. 2D are explained in conjunction with FIG. 4A to FIG. 4E. FIG. 4A to FIG. 4E respectively show a cross-sectional shape taken along a line X-X' in FIG. 2A. In the respective drawings, identical parts and parts having identical functions are given same numerals and symbols.

Figure 4A:
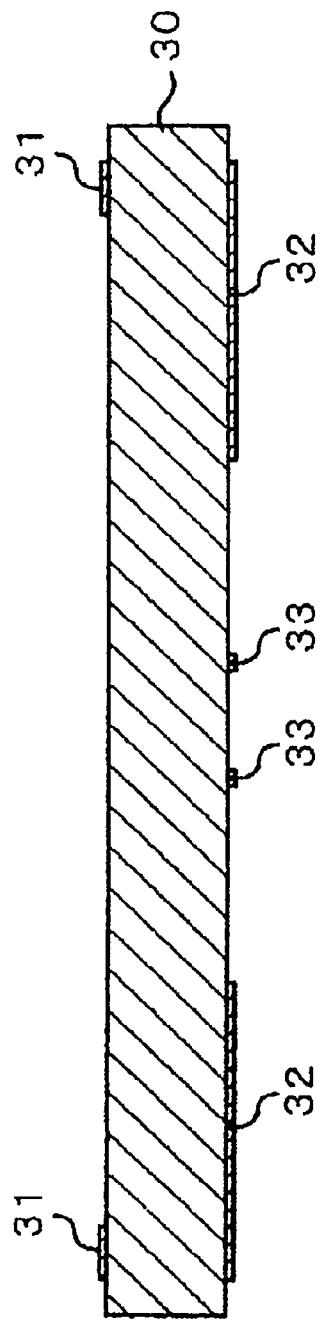

FIG. 4A is a schematic longitudinal cross-sectional view of a silicon single crystal substrate 30. Masks 31, 32, 33 which are respectively formed of a silicon oxide film are formed on a surface of the silicon single crystal substrate 30. A region of the mask 31 which is formed on the front surface of the silicon single crystal substrate 30 is a region where an outer periphery of the fixing part 7 is formed, and a region of the mask 32 formed on a back surface of the silicon single crystal substrate 30 is a region where the outer-periphery fixing part 7a and the element fixing part 7b formed of a recessed portion of the fixing part 7 are formed. A region of the mask 33 formed on a back surface of the silicon single crystal substrate 30 is a region where two movable parts 3 are formed. The oxide films which respectively constitute the masks 31, 32, 33 are formed by thermally oxidizing the silicon single crystal substrate 30 and patterning is performed using a photolithography process and an etching process.

Figure 4B:
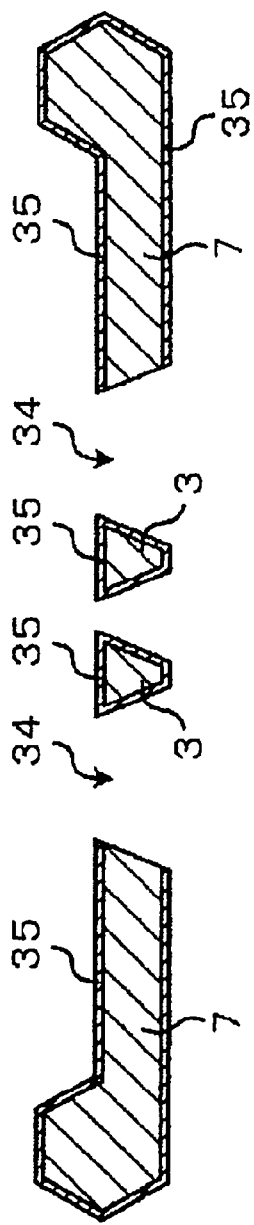

FIG. 4B shows a state in which a portion of the silicon single crystal substrate 30 is removed by etching and, thereafter, a silicon oxide film 35 is formed by thermal oxidation. The silicon single crystal substrate 30 is removed by etching from both surface sides thereof in a wet etching step. Here, the mirror portion 1 and the beam portions 2 are supported on two movable parts 3 arranged at the center of the silicon single crystal substrate 30. Further, a center portion 34 of the silicon single crystal substrate 30 is completely removed. In the silicon single crystal substrate 30, a stepped portion formed by etching is inclined at a predetermined angle due to the crystal orientation of the silicon single crystal substrate 30. Thereafter, the silicon oxide film 35 is formed on the whole surface of the etched silicon single crystal substrate 30 by thermal oxidation.

FIG. 4C shows a state where the lower electrode 6 is formed on the front surface of the silicon single crystal substrate 30. First of all, a platinum (Pt) layer and a titanium (Ti) layer having a thickness of an approximately 0.1 μm respectively are sequentially formed on the surface of the silicon single crystal substrate 30 by stacking using a sputtering method or an electron-beam vapor deposition method. Next, a pattern of the lower electrode 6 is formed in a region (not shown in the drawing) where the piezoelectric body 5 is expected to be stacked using a photolithography process and an etching process. Here, platinum and titanium in regions arranged below regions (not shown in the drawing) where the pad electrodes 8 are expected to be formed are removed.

FIG. 4D shows a state where the piezoelectric body 5 is stacked on the lower electrode 6 through a metal mask 36. A layer made of PZT powder having a thickness of 1 μm to 10 μm is stacked on the movable parts 3 and predetermined regions of the fixing part 7 not shown in the drawing using an AD (aerosol deposition) method. If necessary, the heat treatment may be applied to the piezoelectric body 5 after stacking the piezoelectric body 5.

FIG. 4E shows a state where the upper electrode 4 is formed on the piezoelectric body 5. First of all, a gold (Au) layer having a thickness of approximately 0.1 μm is formed using a sputtering method or an electron-beam vapor deposition method. Next, patterning is performed using a photolithography process and an etching process thus forming the upper electrode 4 having a predetermined shape on a surface of the piezoelectric body 5. Alternatively, in the same manner as the step shown in FIG. 4D, a gold layer having a predetermined shape may be stacked on the surface of the piezoelectric body 5 using a metal mask. Next, the pad electrode 8 formed on the upper electrode 4 and the external electrode are electrically connected with each other by wire bonding. Next, the piezoelectric body 5 is heated to Curie temperature, and an electric field is applied between the upper electrode 4 and the lower electrode 6 thus applying the polarization treatment to the piezoelectric body 5. Here, in the embodiment shown in FIG. 1 and FIG. 2A to FIG. 2D, the lower electrode 6 is removed from the surface of the outer-periphery fixing part 7a.

Here, the above-mentioned manufacturing method merely exemplifies one manufacturing method of the piezoelectric transducer element 20 and the optical scanning device 10 which uses the piezoelectric transducer element 20 according to the present invention. Accordingly, for example, the fixing part 7 and the movable part 3 may be formed using, in place of the silicon single crystal substrate 30, a glass substrate or a metal substrate which forms an insulation film on a surface thereof. Further, although the piezoelectric body 5 is formed by stacking using the AD method in the above-mentioned embodiment, in place of such a method, piezoelectric body 5 is formed in such a manner that patterns of the lower electrode 6 and the upper electrode 4 are applied to a bulk-shaped piezoelectric body, and the bulk-shaped piezoelectric body may be cut in accordance with the patterns, and the patterned piezoelectric body may be adhered and fixed to a base body constituted of the movable part 3 and the fixing part 7.

Embodiment

Figure 5:
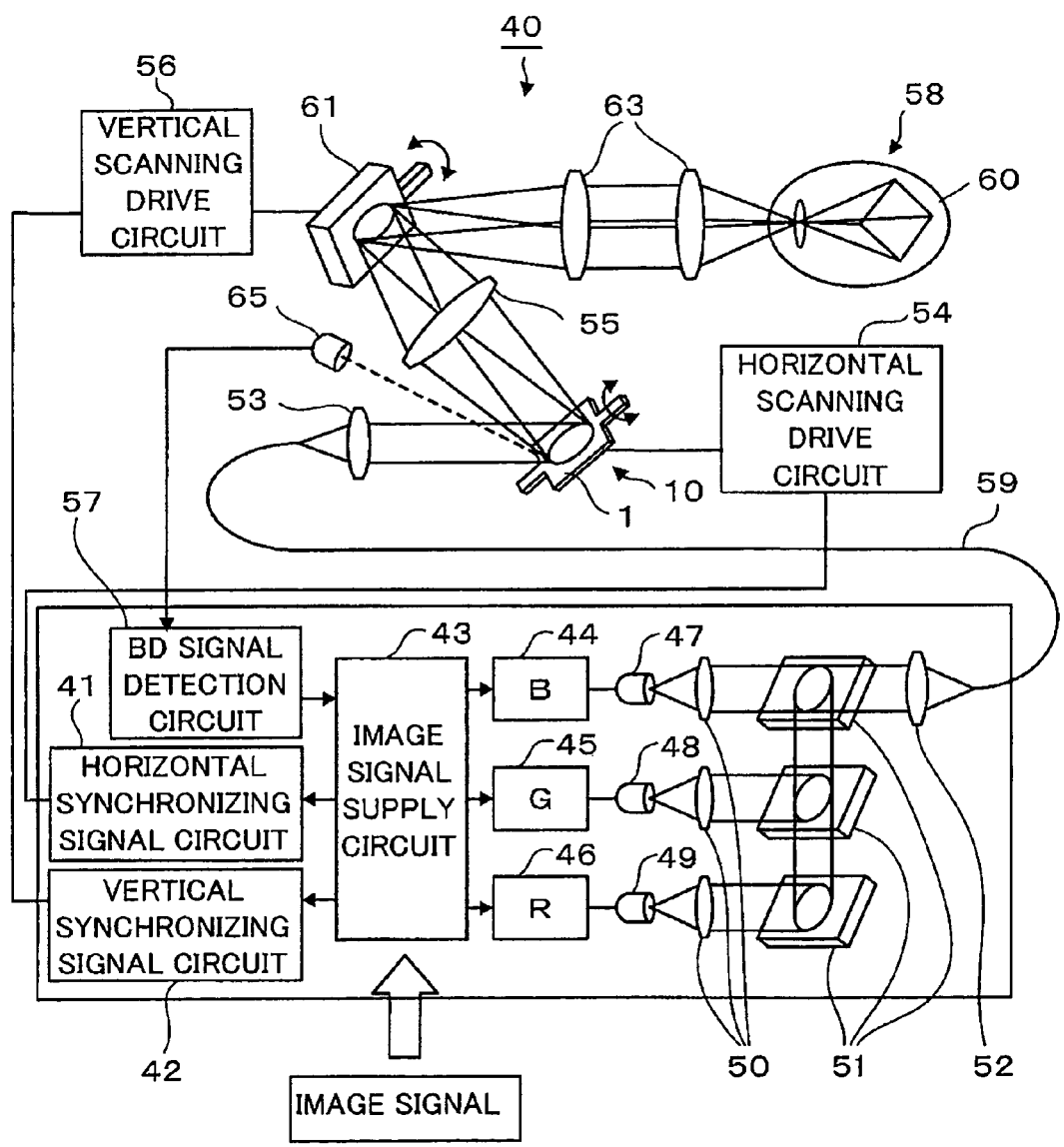
FIG. 5 is a block diagram of an optical scanning display device according to the embodiment of the present invention.
Figure 6C:
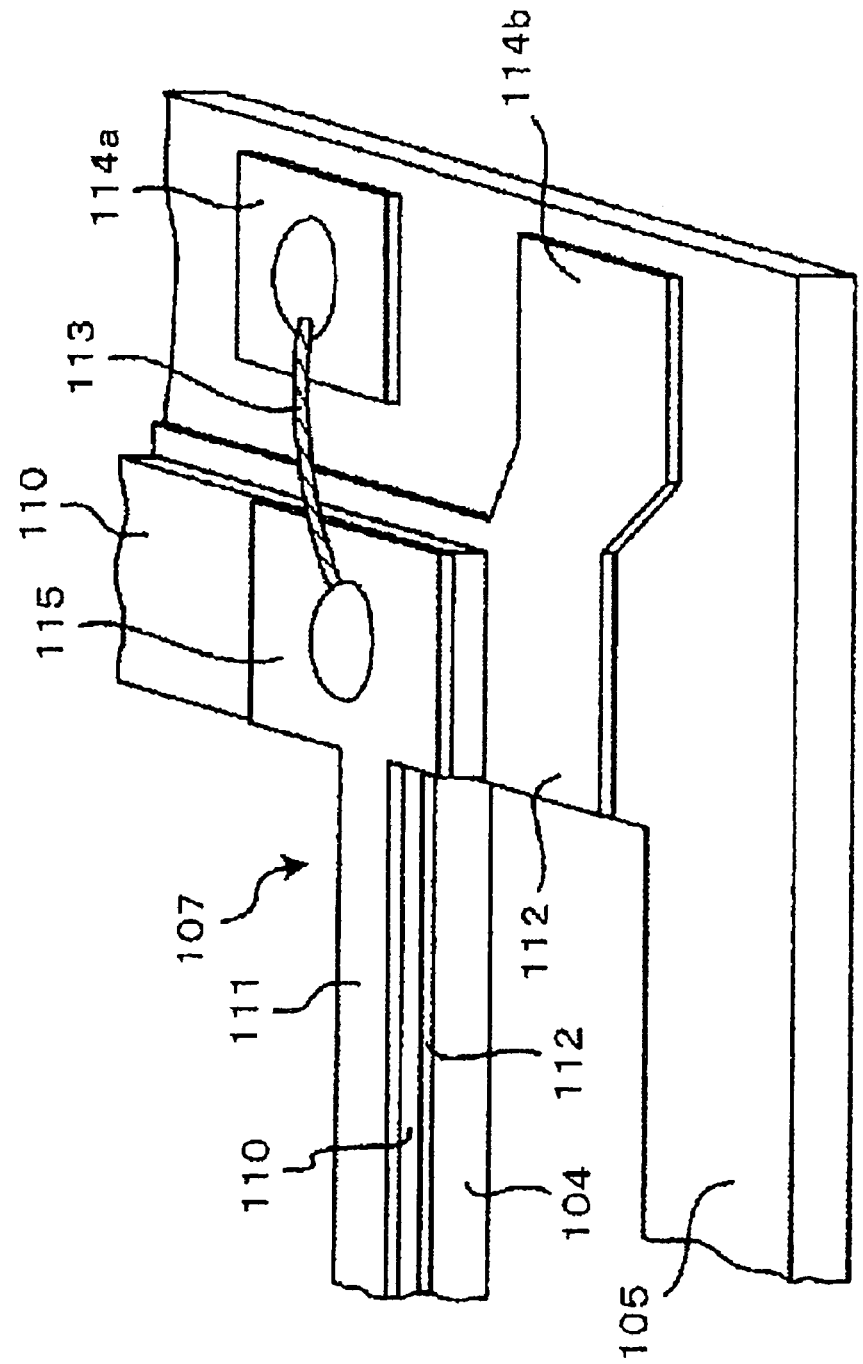
FIG. 6C is a schematic perspective view showing a region in which the strain generating element shown in FIG. 6B is formed in an enlarged manner.

FIG. 5 is a block diagram showing an example of an optical scanning display device 40 according to the present invention. In the drawing, identical parts and parts having identical functions are given same numerals and symbols.

In FIG. 5, the optical scanning display device 40 radiates light having intensity corresponding to an image signal from a light source, scans the light radiated from the light source two-dimensionally by a first optical scanning device and a second optical scanning device, projects the light scanned by the first optical scanning device and the second optical scanning device onto a retina 60 of a viewer's eyeball 58 which constitutes a projection object using a projection lens (eyepiece) thus directly forming an image on the retina 60. That is, image lights which are radiated from a B laser 47 which emits a blue light, a G laser 48 which emits a green light and an R laser 49 which emits a red light are collimated by a collimation optical system 50, are synthesized by dichroic mirrors 51, are converged by a coupling optical system 52, and are guided into an optical fiber 59. The image lights radiated from the optical fiber 59 are radiated to the mirror portion 1 of the optical scanning device 10 (first optical scanning device) which has been explained in conjunction with FIG. 1 to FIG. 4. The mirror portion 1 is driven by a horizontal scanning drive circuit 54 such that the mirror portion 1 oscillates, and scans the reflection light in the horizontal direction which is the first direction. The image light which is scanned in the horizontal direction is radiated to a galvanometer mirror 61 (second optical scanning device) through a relay optical system 55. A mirror surface of the galvanometer mirror 61 is oscillated due to a magnetic field and the galvanometer mirror 61 scans the reflection light in the vertical direction which is the second direction orthogonal to the first direction. The image light reflected from the galvanometer mirror 61 forms an image on the retina 60 of the eyeball 58 through a second relay optical system 63 (lens in the latter stage corresponding to the eyepiece).

An image signal supply circuit 43 receives inputting of a video signal and outputs an image signal corresponding to blue (B), an image signal corresponding to green (G) and an image signal corresponding to red (R) to a B laser drive circuit 44, a G laser drive circuit 45 and an R laser drive circuit 46 respectively. The B laser 47 radiates a blue laser beam whose light intensity is modulated based on an image signal from the B laser drive circuit 44. In the same manner as the B laser 47, the G laser 48 and the R laser 49 also radiate laser beams of respective colors whose light intensities are modulated respectively based on the image signals.

The image signal supply circuit 43 outputs a synchronizing signal which is synchronized with the image signal to the horizontal scanning drive circuit 54 and the vertical scanning drive circuit 56. A horizontal synchronizing signal circuit 41 outputs a horizontal synchronizing signal to the horizontal scanning drive circuit, and a vertical synchronizing signal circuit 42 outputs a vertical synchronizing signal to a vertical scanning drive circuit 56. The horizontal scanning drive circuit 54 outputs a drive signal to the optical scanning device 10 thus oscillating the mirror portion 1 in a swingable manner. In this case, the mirror portion 1 is oscillated based on the resonance oscillations. A photo sensor 65 receives some light which is horizontally scanned by the horizontal scanning drive circuit 54 and converts some light into an electric signal and outputs the electric signal to a BD signal detection circuit 57. The BD signal detection circuit 57 detects timing of the horizontal scanning and outputs a timing signal to the image signal supply circuit 43, and the image signal supply circuit 43 accurately decides start timing of the image signal based on the inputted timing signal.

In the piezoelectric transducer element 20 which constitutes the optical scanning device 10, the lower fixed electrode 6b is not formed below the pad electrode 8 of the upper fixed electrode 4b which is formed above the piezoelectric body 5. As a result, when the piezoelectric transducer element 20 is used as an actuator of the mirror portion 1, since the electrostatic capacitance is lowered, it is possible to drive the mirror portion 1 with low power consumption. Accordingly, it is possible to drive the optical scanning display device 40 with low power consumption. Further, when the piezoelectric transducer element 20 is used as a sensor which detects the oscillations of the mirror portion 1, since the piezoelectric transducer element 20 possesses high-speed response characteristics, it is possible to detect the oscillations of the mirror portion 1 with high accuracy.

Here, in the above-mentioned optical scanning display device 40, although vertical scanning is performed using the galvanometer mirror 61, the vertical scanning may be performed using the optical scanning device 10. In this case, frequency for vertical scanning becomes low, for example, 60 Hz. Accordingly, the oscillations of the mirror portion are generated using a twist angle control of the mirror portion in response to electric signals without making use of resonance oscillations.

Further, in FIG. 5, the explanation has been made with respect to the example where the optical scanning device 10 is applied to a retinal scanning display. However, by replacing the second relay optical system 63 with a projection lens system and by setting a projection screen or a wall of a building as the projection object in place of the eyeball 58, the optical scanning device 10 is applicable to a projection-type optical scanning display. In the embodiment explained in conjunction with FIG. 5, although an RGB full color display device is taken as an example. However, for example, by allowing an optical scanning display device to scan laser beams of one color or two colors, it is possible to realize a large-screen-use optical scanning display device.

What is claimed is:

1. A piezoelectric transducer element comprising:
   a base body which includes a fixing part and a movable part which are connected with each other;
   a lower electrode which is formed on a surface of the base body;
   a piezoelectric body which is formed in a stacked manner in a state where the piezoelectric body extends between and over the fixing part and the movable part of the base body; and
   an upper electrode which is formed on a surface of the piezoelectric body on a side opposite to the base body, wherein
   the piezoelectric body is configured to convert a change in potential between the lower electrode and the upper electrode into mechanical displacement of the movable part relative to the fixing part or the mechanical displacement into the change in potential, and
   the upper electrode includes a pad electrode for connection which is formed above the fixing part, and the lower electrode is not formed in a region above the fixing part and below the pad electrode.

2. A piezoelectric transducer element according to claim 1, wherein the upper electrode includes an upper movable electrode which is formed above the movable part, and an upper fixed electrode which is formed above the fixing part and has the pad electrode,
   the lower electrode includes a lower movable electrode which is formed above the movable part, and a lower fixed electrode which is formed above the fixing part,
   an area where the upper fixed electrode and the lower fixed electrode overlap with each other in an opposed manner with the piezoelectric body interposed therebetween is equal to or smaller than an area where the upper movable electrode and the lower movable electrode overlap with each other in an opposed manner with the piezoelectric body interposed therebetween.

3. A piezoelectric transducer element according to claim 2, wherein the upper movable electrode and the lower movable electrode have rod-like rectangular shapes which face each other in an opposed manner respectively, and an area where the upper fixed electrode and the lower fixed electrode overlap with each other in an opposed manner with the piezoelectric body interposed therebetween is equal to or smaller than an area where the rod-like rectangular shapes overlap each other in an opposed manner.

4. An actuator having a piezoelectric transducer element, wherein
   the piezoelectric transducer element comprises:
   a base body which includes a fixing part and a movable part which are connected with each other;
   a lower electrode which is formed on a surface of the base body;
   a piezoelectric body which is formed in a stacked manner in a state where the piezoelectric body extends between and over the fixing part and the movable part of the base body; and
   an upper electrode which is formed on a surface of the piezoelectric body on a side opposite to the base body, wherein the piezoelectric body is configured to convert a change in potential between the lower electrode and the upper electrode into mechanical displacement of the movable part relative to the fixing part or the mechanical displacement into the change in potential, and the upper electrode includes a pad electrode for connection which is formed above the fixing part, and the lower electrode is not formed in a region above the fixing part and below the pad electrode.

5. A sensor having a piezoelectric transducer element and capable of detecting oscillations or a stress, wherein the piezoelectric transducer element comprises:

a base body which includes a fixing part and a movable part which are connected with each other;

a lower electrode which is formed on a surface of the base body;

a piezoelectric body which is formed in a stacked manner in a state where the piezoelectric body extends between and over the fixing part and the movable part of the base body; and an upper electrode which is formed on a surface of the piezoelectric body on a side opposite to the base body, wherein the piezoelectric body is configured to convert a change in potential between the lower electrode and the upper electrode into mechanical displacement of the movable part relative to the fixing part or the mechanical displacement into the change in potential, and the upper electrode includes a pad electrode for connection which is formed above the fixing part, and the lower electrode is not formed in a region above the fixing part and below the pad electrode.

6. An optical scanning device comprising:

a piezoelectric transducer element;

a mirror portion which includes a reflection surface for reflecting a light; and a beam portion with elasticity which is configured to support the mirror portion and is connected to a movable part of the piezoelectric transducer element, wherein the piezoelectric transducer element comprises:

a base body which includes a fixing part and a movable part which are connected with each other;

a lower electrode which is formed on a surface of the base body;

a piezoelectric body which is formed in a stacked manner in a state where the piezoelectric body extends between and over the fixing part and the movable part of the base body; and an upper electrode which is formed on a surface of the piezoelectric body on a side opposite to the base body, wherein the piezoelectric body is configured to convert a change in potential between the lower electrode and the upper electrode into mechanical displacement of the movable part relative to the fixing part or the mechanical displacement into the change in potential, and the upper electrode includes a pad electrode for connection which is formed above the fixing part, and the lower electrode is not formed in a region above the fixing part and below the pad electrode, whereby a change in potential is imparted between the lower electrode and the upper electrode so as to generate oscillations or swinging of the mirror portion thus scanning a reflection light reflected from the mirror portion.

7. An optical scanning display device comprising:

a light source which radiates light having intensity corresponding to an image signal;

a first optical scanning device which scans the light radiated from the light source in the first direction;

a second optical scanning device which scans the light scanned by the first optical scanning device in the second direction orthogonal to the first direction; and a projection part which projects the light scanned by the second optical scanning device onto a projection object, wherein at least one of the first optical scanning device and the second optical scanning device includes: a piezoelectric transducer element; a mirror portion which includes a reflection surface for reflecting a light; and a beam portion with elasticity which is configured to support the mirror portion and is connected to a movable part of the piezoelectric transducer element, and the piezoelectric transducer element includes:

a base body which includes a fixing part and a movable part which are connected with each other;

a lower electrode which is formed on a surface of the base body;

a piezoelectric body which is formed in a stacked manner in a state where the piezoelectric body extends between and over the fixing part and the movable part of the base body; and an upper electrode which is formed on a surface of the piezoelectric body on a side opposite to the base body, wherein the piezoelectric body is configured to convert a change in potential between the lower electrode and the upper electrode into mechanical displacement of the movable part relative to the fixing part or the mechanical displacement into the change in potential, and the upper electrode includes a pad electrode for connection which is formed above the fixing part, and the lower electrode is not formed in a region above the fixing part and below the pad electrode, whereby a change in potential is imparted between the lower electrode and the upper electrode so as to generate oscillations or swinging of the mirror portion thus scanning a reflection light reflected from the mirror portion.

* * * * *